(12) United States Patent
Ando et al.

(10) Patent No.: US 7,834,619 B2
(45) Date of Patent: Nov. 16, 2010

(54) MAGNETIC DETECTION DEVICE

(75) Inventors: Hideto Ando, Niigata-ken (JP); Shinji Sugihara, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/703,401

(22) Filed: Feb. 10, 2010

(65) Prior Publication Data
US 2010/0141251 A1     Jun. 10, 2010

Related U.S. Application Data

(63) Continuation of application No. PCT/JP2008/065773, filed on Sep. 2, 2008.

(30) Foreign Application Priority Data

Sep. 3, 2007     (JP) ............................. 2007-227574

(51) Int. Cl.
*G01R 33/02* (2006.01)
(52) U.S. Cl. ................. 324/252; 324/207.21; 338/32 R
(58) Field of Classification Search ............ 324/207.21, 324/252; 338/32 R
See application file for complete search history.

(56) References Cited

U.S. PATENT DOCUMENTS

| | | | | |
|---|---|---|---|---|
| 4,480,248 A | * | 10/1984 | Sudo et al. | ................ 338/32 R |
| 6,069,476 A | * | 5/2000 | Vieux-Rochaz et al. | ..... 324/252 |
| 6,732,583 B1 | * | 5/2004 | Yasuda et al. | ............ 73/204.26 |
| 2006/0152218 A1 | | 7/2006 | Schmollngruber et al. | |

FOREIGN PATENT DOCUMENTS

| | | |
|---|---|---|
| JP | 1-24617 | 8/1990 |
| JP | 2004-207540 | 7/2004 |

* cited by examiner

*Primary Examiner*—Reena Aurora
(74) *Attorney, Agent, or Firm*—Brinks Hofer Gilson & Lione

(57) ABSTRACT

A magnetic detection device includes a sensor unit including a sensor pattern having a plurality of magnetoresistance effect films whose ends in the length direction thereof are coupled via return portions, and electrode units formed at both ends of the sensor pattern in the longitudinal direction thereof. A non-magnetic conductor is electrically connected across a top surface of one of a pair of magnetoresistance effect films that are coupled via the corresponding one of the return portions and that face each other and a top surface of the other magnetoresistance effect film. Therefore, the resistance value between the electrode units can be adjusted without increasing the dimensions of the sensor unit, and deterioration or variation in magnetic characteristics can be reduced.

6 Claims, 8 Drawing Sheets

MAGNETIC DETECTION DEVICE

CLAIM OF PRIORITY

This application is a Continuation of International Application No. PCT/JP2008/065773 filed on Sep. 2, 2008, which claims benefit of the Japanese Patent Application No. 2007-227574 filed on Sep. 3, 2007, both of which are hereby incorporated by reference.

BACKGROUND OF THE INVENTION

1. Field of the Invention

The present invention relates to a magnetic detection device capable of adjusting the resistance value of a sensor unit including a sensor pattern having magnetoresistance effect films and electrode units without increasing the dimensions of the sensor unit.

2. Description of the Related Art

A magnetic detection device configured to detect an external magnetic field has, for example, a magnetoresistance effect film that utilizes the magnetoresistance effect. The magnetoresistance effect is the change in the electric resistance value in accordance with an external magnetic field applied.

FIG. 11 is an enlarged plan view of a sensor unit 1 of the related art. The sensor unit 1 is configured to include a meandering sensor pattern 2 having the above magnetoresistance effect film, and electrode units 3 and 4 that are connected to ends 2a and 2b of the sensor pattern 2 in its longitudinal direction, respectively.

As illustrated in FIG. 11, a projecting portion 5 that projects outward from the sensor pattern 2 in its width direction (in FIG. 11, in the X direction) is formed integrally with the electrode unit 3.

The resistance value between the electrode units 3 and 4 (hereinafter referred to as the "resistance value of the sensor unit 1") is measured. When the measured resistance value is greater than that of a fixed resistor unit (not illustrated) connected in series with the sensor unit 1, in order to make the resistance value of the sensor unit 1 match the resistance value of the fixed resistor unit, the sensor pattern 2 is electrically connected to the projecting portion 5 via a conductor 7 at an intermediate position of the sensor pattern 2 to reduce the current path length of the sensor pattern 2. Accordingly, the resistance value of the sensor unit 1 can be adjusted so as to match the resistance value of the fixed resistor unit.

However, the method of adjusting the resistance value of the sensor unit 1 illustrated in FIG. 11 has a problem in that the provision of the projecting portion 5 that projects outward from the sensor pattern 2 in its width direction (in FIG. 1, the X direction) results in an increase in the dimension of the sensor unit 1 in its width direction (in FIG. 11, the X direction).

Japanese Unexamined Patent Application Publication No. 2004-207540 does not disclose a resistance adjustment method for a sensor pattern having magnetoresistance effect films. As illustrated in FIG. 11, furthermore, a space T1 between magnetoresistance effect films that are coupled via a return portion 2c of the sensor pattern 2, which is used in a magnetic detection device, and that face each other is as narrow as about 1 to 10 μm. Thus, it is difficult to form the conductor 7 only within the space T1 so as to establish stable electrical connection between the conductor 7 and the sensor pattern 2 without causing contact failure therebetween because the contact area between the conductor 7 and the sensor pattern 2 is small.

SUMMARY OF THE INVENTION

The present invention overcomes the foregoing problems of the related art, and specifically provides a magnetic detection device capable of adjusting the resistance value of a sensor unit including a sensor pattern having magnetoresistance effect films and electrode units without increasing the dimensions of the sensor unit and capable of reducing deterioration or variation in magnetic characteristics.

An aspect of the present invention provides a magnetic detection device includes a sensor unit including a sensor pattern having a plurality of magnetoresistance effect films that utilize a magnetoresistance effect in which electric resistance values vary in accordance with an external magnetic field applied, and electrode units disposed at both ends of the sensor pattern in a longitudinal direction thereof, ends of the plurality of magnetoresistance effect films in a length direction thereof being coupled via return portions. A non-magnetic conductor is electrically connected across a top surface of one magnetoresistance effect film and a top surface of another magnetoresistance effect film, the one magnetoresistance effect film and the other magnetoresistance effect film being disposed so as to be coupled via a corresponding one of the return portions, and a resistance value between the electrode units is adjusted.

Therefore, the resistance value between the electrode units (the resistance value of the sensor unit) can be adjusted without increasing the dimensions of the sensor unit. In addition, since the conductor is connected to the top surfaces of the magnetoresistance effect films, a large contact area can be ensured between the conductor and the magnetoresistance effect films, thus establishing stable electrical connection between the conductor and the magnetoresistance effect films. Furthermore, since the conductor is non-magnetic, deterioration or variation in magnetic characteristics, which may be caused by the connection between the conductor and the magnetoresistance effect films, can be reduced.

Preferably, each of the magnetoresistance effect films has a laminate structure including a magnetic layer and a non-magnetic layer, the topmost layer of the laminate structure being a non-magnetic protective layer, and at least in a portion of the magnetoresistance effect films where the conductor is to be connected, the conductor is electrically connected to the top surface of the protective layer with an oxidation layer on a top surface of the protective layer having been removed. This can further facilitate stable electrical connection between the magnetoresistance effect films and the conductor. Furthermore, since only the oxidation layer of the non-magnetic protective layer of the magnetoresistance effect film is removed so as to leave the magnetic layer as it is, which greatly contributes to the magnetic characteristics, deterioration or variation in magnetic characteristics relative to the structure in which no conductor is provided can be kept small.

In the magnetic detection device, a magnetic layer may underlie the protective layer, and in a portion of the magnetoresistance effect films where the conductor is to be connected, the conductor may be connected to the top surface of the magnetic layer with the protective layer and a portion of the magnetic layer having been removed. Specifically, each of the magnetoresistance effect films can be configured such that layers are stacked in order of, from the bottom, an antiferromagnetic layer, a fixed magnetic layer, a non-magnetic material layer, a free magnetic layer, and a protective layer, and in a portion of the magnetoresistance effect films where the conductor is to be connected, the conductor can be electrically connected to the top surface of the free magnetic layer with the protective layer and a portion of the free magnetic layer having been removed.

In the magnetic detection device, furthermore, a portion of at least one of the magnetoresistance effect films to which the conductor is to be connected may have a void portion formed therein, the void portion being formed by removing all layers included in the laminate structure of the magnetoresistance effect film (in the above configuration, a void portion formed by removing all layers of the magnetoresistance effect film, including the antiferromagnetic layer which is the bottom layer), and the conductor may be formed in the void portion and is electrically connected to the magnetoresistance effect film.

Preferably, each of the magnetoresistance effect films has an elongated shape in which a dimension in a length direction is longer than a dimension in a width direction. Preferably, the sensor pattern has a meandering shape.

DESCRIPTION OF THE PREFERRED EMBODIMENTS

Figure 1:
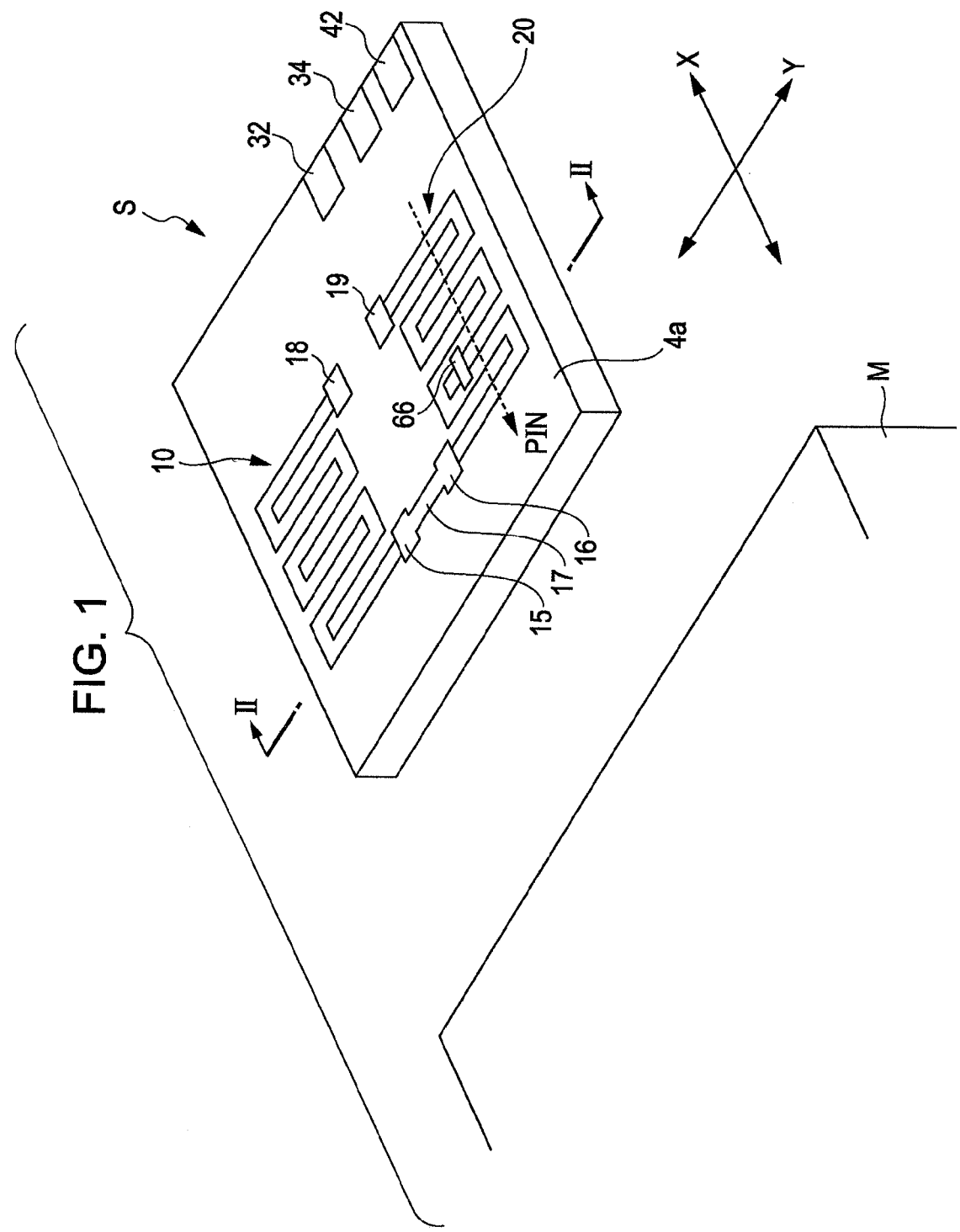
FIG. 1 is a perspective view of a magnetic detection device according to an embodiment of the present invention.
Figure 2:
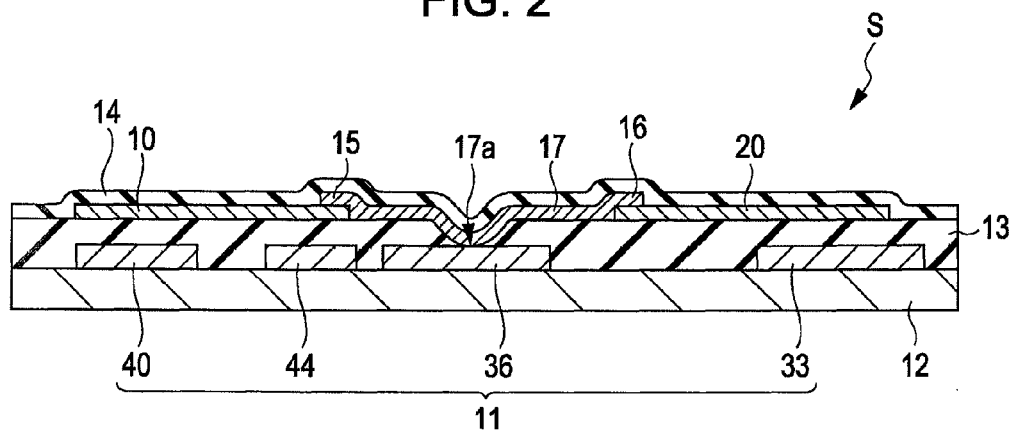
FIG. 2 is a longitudinal cross-sectional view of the magnetic detection device illustrated in FIG. 1, taken along the line II-II.
Figure 3:
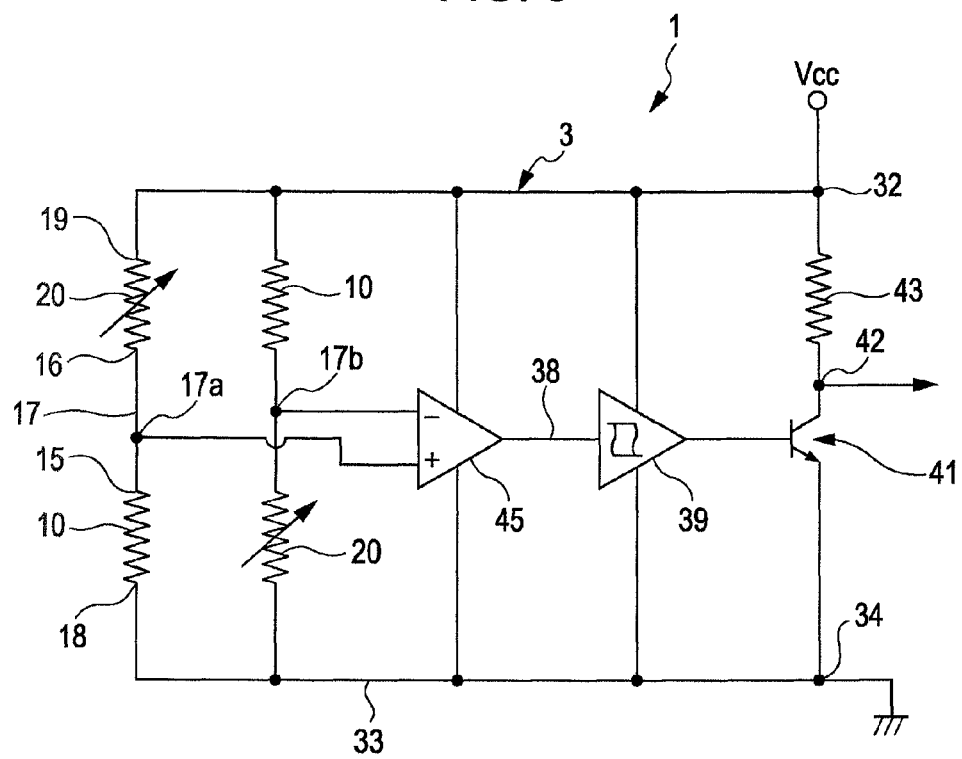
FIG. 3 is a circuit configuration diagram of the magnetic detection device.
Figure 4:
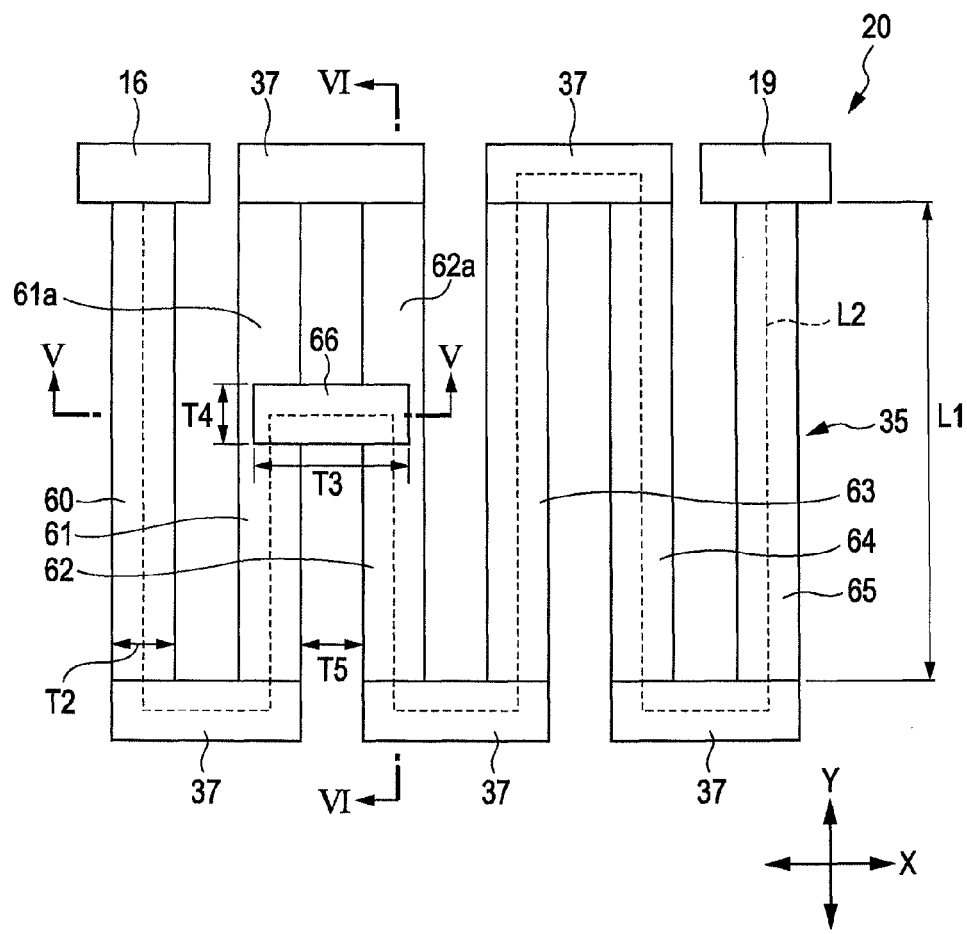
FIG. 4 is an enlarged plan view of a sensor unit illustrated in FIG. 1.
Figure 5:
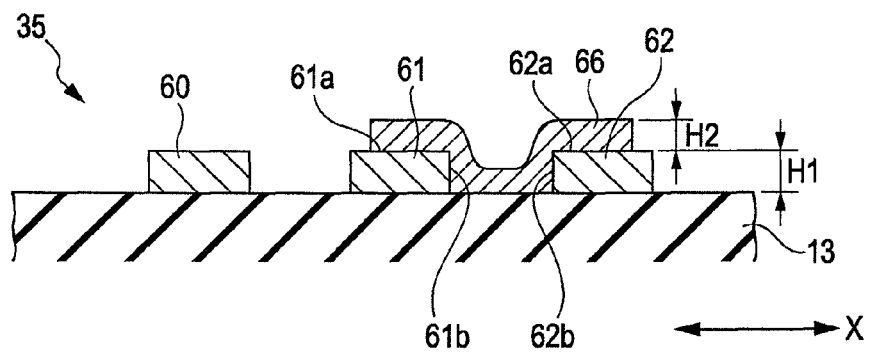
FIG. 5 is a partial cross-sectional view of the sensor unit illustrated in FIG. 4, taken along the line V-V in the thickness direction, as viewed from the arrow direction.
Figure 6:
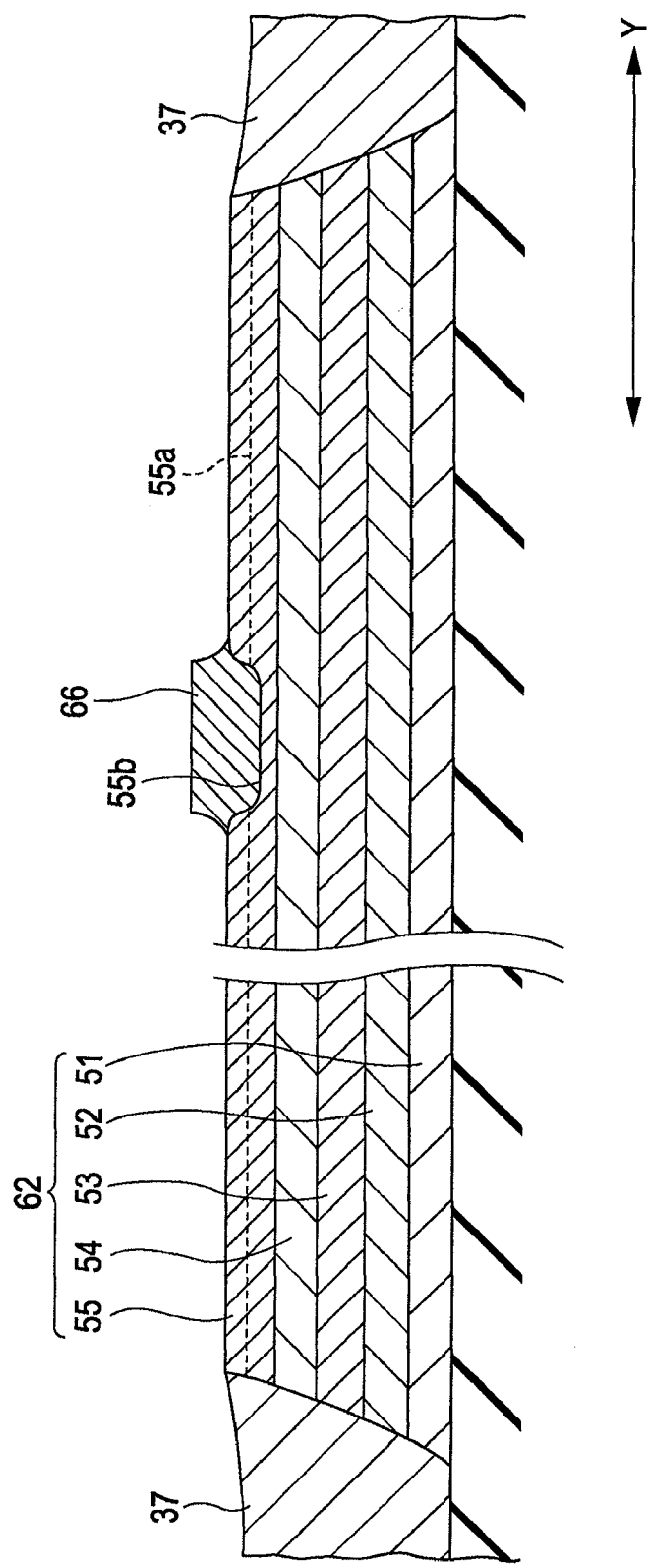
FIG. 6 is a partial enlarged cross-sectional view of the sensor unit illustrated in FIG. 4, taken along the line VI-VI in the thickness direction, as viewed from the arrow direction.

FIG. 1 is a perspective view of a magnetic detection device according to an embodiment of the present invention, and FIG. 2 is a longitudinal cross-sectional view of the magnetic detection device illustrated in FIG. 1, taken along the line II-II. FIG. 3 is a circuit configuration diagram of the magnetic detection device. FIG. 4 is an enlarged plan view of a sensor unit 20 illustrated in FIG. 1. FIG. 5 is a partial cross-sectional view of the sensor unit 20 illustrated in FIG. 4, taken along the line V-V in the thickness direction, as viewed from the arrow direction, and FIG. 6 is a partial enlarged cross-sectional view of the sensor unit 20 illustrated in FIG. 4, taken along the line VI-VI in the thickness direction, as viewed from the arrow direction.

A magnetic detection device S illustrated in FIG. 1 is configured such that the sensor unit 20, a fixed resistor unit 10, and an integrated circuit 11 (see FIG. 2) are integrated into a package, and is configured to be compact and thin in profile. The magnetic detection device S is designed to detect an external magnetic field generated from a magnetic field generating member such as a magnet M. The magnetic detection device S may be incorporated in an electronic apparatus such as a foldable mobile phone or an electric appliance such as a refrigerator, and may be used for sensing the opening and closing movements thereof or the like. Alternatively, the magnetic detection device S can also be used in a magnetic encoder, a potentiometer, or the like.

As illustrated in FIG. 1, the sensor unit 20 and the fixed resistor unit 10 have a meandering shape in their plan view, and basically have a high electric resistance value.

In the example illustrated in FIG. 1, one sensor unit 20 and one fixed resistor unit 10 are provided and are directly connected to each other via an output extraction portion 17a (see, for example, FIG. 2). Preferably, as illustrated in, for example, FIG. 3, two sensor units 20 and two fixed resistor units 10 are provided to form a bridge circuit.

As illustrated in FIG. 2, the magnetic detection device S according to the present embodiment is configured such that the integrated circuit 11 is formed on a silicon (Si) substrate 12. The integrated circuit 11 is configured using various active elements 33 and 40 such as a differential amplifier and a comparator, a wiring layer 36, a resistor 44, and any other suitable device. The integrated circuit 11 is covered with an insulating layer 13.

The sensor unit 20 and the fixed resistor unit 10 are formed on the insulating layer 13. As illustrated in FIG. 1, an electrode unit 16, which may be formed of a low-resistance material, is disposed at an end of the sensor unit 20, and an electrode unit 19, which may also be formed of a low-resistance material, is disposed at the other end of the sensor unit 20. An electrode unit 15, which may be formed of a low-resistance material, is disposed at an end of the fixed resistor unit 10, and an electrode unit 18, which may be formed of a low-resistance material, is also disposed at the other end of the fixed resistor unit 10. The electrode unit 16 of the sensor unit 20 and the electrode unit 15 of the fixed resistor unit 10 are connected to each other using a lead layer 17, and the sensor unit 20 and the fixed resistor unit 10 are connected in series.

Further, as illustrated in FIG. 2, the lead layer 17 extends through the insulating layer 13 and is connected to the wiring layer 36. A portion of the lead layer 17 that is connected to the wiring layer 36 serves as the output extraction portion 17a.

As illustrated in FIG. 2, the top surface of the sensor unit 20 and the fixed resistor unit 10 is protected by an insulating layer 14 such as an alumina ($Al_2O_3$) or silicon dioxide ($SiO_2$) layer. Further, as illustrated in FIG. 1, a power supply pad 32, a ground pad 34, and an output pad 42 are exposed on a surface of the magnetic detection device S.

As illustrated in FIG. 3, a power supply voltage Vcc is applied to the power supply pad 32, and the ground pad 34 is set to a ground potential. As illustrated in FIG. 3, when the sensor units 20 and the fixed resistor units 10 form a bridge circuit, output extraction portions 17a and 17b of the bridge circuit are connected to a differential amplifier 45. An output voltage obtained from the bridge circuit is differentially amplified using the differential amplifier 45. The output of the differential amplifier 45 is supplied to, for example, a Schmitt-trigger comparator 39 to produce a rectangular wave in which noise is removed. An output potential that is determined by an output transistor 41 and an output resistor 43 is supplied to the output pad 42 illustrated in FIG. 1.

The configuration of the sensor unit 20 will now be described. As described above, the sensor unit 20 is defined on the insulating layer 13 that is disposed with the surface flatten on the substrate 12.

As illustrated in FIG. 4, the sensor unit 20 is configured to include a meandering sensor pattern 35, and the electrode units 16 and 19. The electrode units 16 and 19 are disposed at both ends of the sensor pattern 35 in its longitudinal direction (the direction extending along the sensor pattern 35).

As illustrated in FIG. 4, the sensor pattern 35 includes a plurality of magnetoresistance effect films 60 to 65 each extending in a straight line and having an elongated shape in which the dimension L1 in the length direction (in FIG. 4, the Y-direction) is longer than the dimension T2 in the width direction (in FIG. 4, the X-direction), and return portions 37 for coupling the ends of the magnetoresistance effect films 60 to 65 in their length direction (in FIG. 4, the Y direction).

In this embodiment, the return portions 37 can be formed of hard bias layers.

As illustrated in FIG. 6, each of the magnetoresistance effect films 60 to 65 (in FIG. 6, the magnetoresistance effect film 62 is illustrated by way of example; all the other magnetoresistance effect elements have the same laminate structure) includes an antiferromagnetic layer 51, a fixed magnetic layer 52, a non-magnetic material layer 53, a free magnetic layer 54, and a protective layer 55 which are stacked in this order from the bottom. For example, the antiferromagnetic layer 51 may be formed of IrMn, the fixed magnetic layer 52 may be formed of CoFe, the non-magnetic material layer 53 may be formed of Cu, the free magnetic layer 54 may be formed of NiFe, and the protective layer 55 may be formed of Ta. The magnetization of the fixed magnetic layer 52 is fixed in one direction, and, in this embodiment, as illustrated in FIG. 1, is fixed in the X direction in FIG. 1 (see the "PIN" direction in FIG. 1). The magnetization of the free magnetic layer 54, on the other hand, is not fixed and varies in accordance with an external magnetic field applied. In this embodiment, under the magnetic-field-free condition where no external magnetic field is applied, the magnetization of the free magnetic layer 54 is aligned in the Y direction in FIG. 6 in accordance with biased magnetic fields applied from the return portions 37 which are formed of hard bias layers. Although the types or order of layers constituting the magnetoresistance effect films 60 to 65 is not limited to that illustrated in FIG. 6, each of the magnetoresistance effect films 60 to 65 preferably includes at least the antiferromagnetic layer 51, the fixed magnetic layer 52, the non-magnetic material layer 53, the free magnetic layer 54, and the protective layer 55.

The fixed resistor unit 10 is configured using a single layer of resistor layer or a laminate structure. When the fixed resistor unit 10 is configured using a laminate structure, the same layers as those constituting each of the magnetoresistance effect films 60 to 65 are used, and the free magnetic layer 54 and the non-magnetic material layer 53 are stacked in reverse order. This prevents the layer corresponding to the free magnetic layer 54 from varying in accordance with an external magnetic field applied, thus achieving a fixed resistor. In this configuration, furthermore, variations in temperature coefficient of resistance (TCR) of the fixed resistor unit 10 and the sensor unit 20 can be reduced, which is preferable.

As illustrated in FIGS. 4 and 5, a non-magnetic conductor 66 is electrically connected across a top surface 62*a* of the magnetoresistance effect film 62 and a top surface 61*a* of the magnetoresistance effect film 61 coupled via the return portion 37 and facing each other, which are illustrated on the left and right portions of the figures, respectively. As illustrated in FIG. 5, the conductor 66 is formed across the top surfaces 61*a* and 62*a* of the magnetoresistance effect films 61 and 62, side surfaces 61*b* and 62*b* extending in the X direction in FIG. 5, and a portion of the insulating layer 13 that is exposed between the magnetoresistance effect films 61 and 62.

The conductor 66 is formed of a non-magnetic conductive material having a resistance value that is sufficiently lower than that of the magnetoresistance effect films 60 to 65. Specifically, the magnetoresistance effect films 60 to 65 may have resistance values of 500Ω to 1000Ω (resistivity of 20 ohms per square), and the conductor 66 may have a resistance value of 50 mΩ to 100Ω (resistivity of 1.7 μΩ·cm to 30 μΩ·cm). The conductor 66 may be formed of Cu, Au, Ag, Cr, Ta, W, Al, or the like. The conductor 66 may be formed using sputtering, plating, or any other suitable method.

In the present embodiment, as illustrated in FIG. 4, the conductor 66 is electrically connected between the top surfaces 61*a* and 62*a* of the magnetoresistance effect films 61 and 62 that are coupled via the return portion 37 and that face each other to adjust the resistance value between the electrode units 16 and 19 (hereinafter referred to as "the resistance value of the sensor unit 20").

For example, the resistance value of the sensor unit 20 is measured in the absence of the conductor 66 and under the magnetic-field-free condition where no external magnetic field is applied, and is compared with the resistance value of the fixed resistor unit 10 connected in series with the sensor unit 20. In the following description, the term "resistance value" refers to the resistance value obtained under the magnetic-field-free condition unless otherwise specified.

In order to obtain the midpoint potential, the resistance values of the sensor unit 20 and the fixed resistor unit 10 are made to match each other. In this case, when the resistance value of the sensor unit 20 is greater than the resistance value of the fixed resistor unit 10, the resistance value of the sensor unit 20 is adjusted using the conductor 66. In the present embodiment, the resistance value of the sensor unit 20 is set in advance so as to be greater than the resistance value of the fixed resistor unit 10 in the absence of the conductor 66.

Then, as illustrated in FIG. 4, when the conductor 66 is electrically connected between the top surface 61*a* of the magnetoresistance effect film 61 and the top surface 62*a* of the magnetoresistance effect film 62, the path length of current flowing in the sensor pattern 35 from the electrode units 16 and 19 is reduced, as indicated by L2 illustrated in FIG. 4 (the schematic representation of the current path length L2 is illustrated at the center position in the width direction). Therefore, the resistance value of the sensor unit 20 can be lower than that in the absence of the conductor 66, and can be adjusted so as to match the resistance value of the fixed resistor unit 10.

Figure 11:
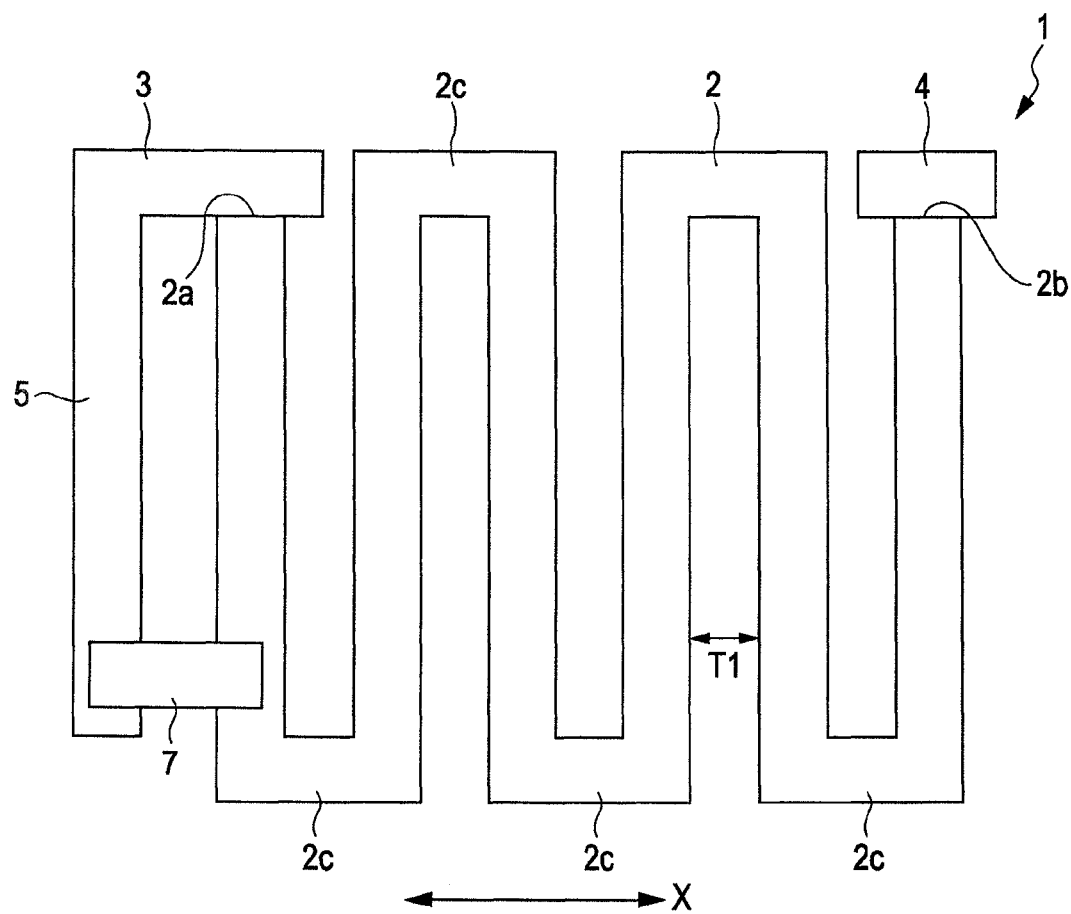
FIG. 11 is a plan view of a sensor unit having a structure of the related art.

In contrast to the structure of the related art illustrated in FIG. 11, in the present embodiment, since the conductor 66 is electrically connected directly between the top surface 61*a* of the magnetoresistance effect film 61 and the top surface 62*a* of the magnetoresistance effect film 62, the resistance of the sensor unit 20 can be adjusted without increasing the dimension of the sensor unit 20 in its width direction (in FIG. 4, the X-direction). The dimension of the sensor unit 20 in its length direction (in FIG. 4, the Y-direction), as well as the dimension in the width direction, is not increased.

In addition, since the conductor 66 is connected to the top surface 61*a* of the magnetoresistance effect films 61 and the top surface 62*a* of the magnetoresistance effect film 62 (preferably, connected across the top surfaces 61*a* and 62*a* and the side surfaces 61*b* and 62*b*), the contact area between the conductor 66 and the magnetoresistance effect films 61 and 62 can be increased. This provides stable electrical connection between the conductor 66 and the magnetoresistance effect films 61 and 62 without causing any contact failure.

Furthermore, since the conductor 66 is non-magnetic, even a structure in which the conductor 66 is connected to the magnetoresistance effect films 61 and 62 can reduce deterioration or variation in magnetic characteristics in contrast to a structure in which the conductor 66 is not connected.

Specific values will now be described. Referring to FIG. 4, the dimension T2 of each of the magnetoresistance effect films 60 to 65 in its width direction may be 2 to 10 μm, the dimension L1 of each of the magnetoresistance effect films 60 to 65 in its length direction may be 20 to 300 μm, the dimension T3 of the conductor 66 in the direction where the magnetoresistance effect films 61 and 62 are connected (in FIG. 4, the X direction) may be 3 to 20 μm, the dimension T4 of the conductor 66 in the direction perpendicular to that of the dimension T3 (in FIG. 4, the Y direction) may be 5 to 20 μm, and each of the spaces T5 between the magnetoresistance effect films 60 to 65 may be 2 to 10 μm. Referring to FIG. 5, each of the magnetoresistance effect films 60 to 65 may have a thickness H1 of 20 to 30 nm, and the conductor 66 may have a thickness H2 (on the top surfaces 61a and 62a of the magnetoresistance effect films 61 and 62) of 100 to 300 nm.

As illustrated in FIG. 6, the protective layer 55, which is the topmost layer of the magnetoresistance effect film 62 and which serves to prevent oxidation of the free magnetic layer 54, has a thin oxidation layer 55a formed on a surface thereof.

Therefore, as illustrated in FIG. 6, at least in a portion where the conductor 66 is to be connected, the conductor 66 is connected to a top surface 55b of the protective layer 55 from which the oxidation layer 55a defined on the surface of the protective layer 55 has been removed by etching, thus providing stable electrical connection between the conductor 66 and the magnetoresistance effect films 61 and 62.

Figure 7:
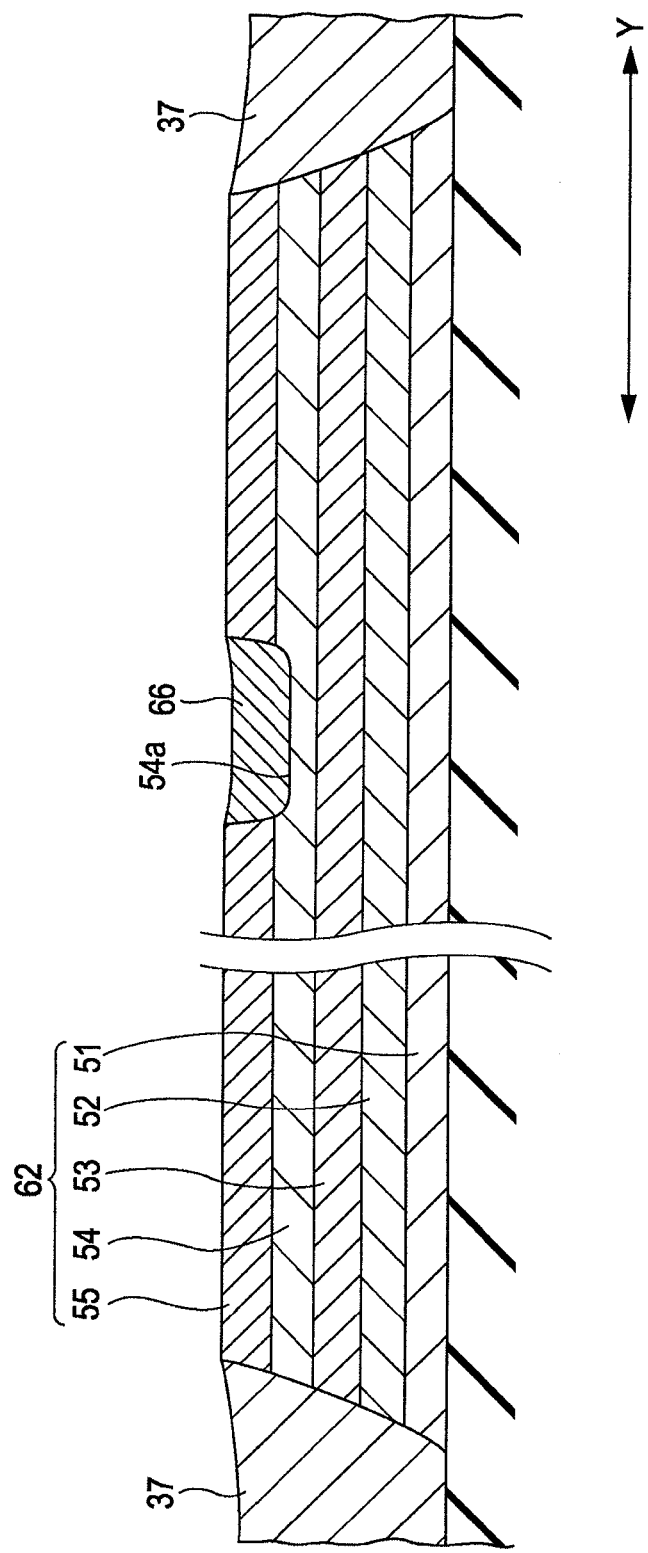
FIG. 7 is a partial cross-sectional view of a sensor unit according to another embodiment of the present invention, which is different from that illustrated in FIG. 6.

Furthermore, as illustrated in FIG. 7, the protective layer 55 and a portion of the free magnetic layer 54 may be removed in a portion where the conductor 66 is to be connected, and the conductor 66 may be connected to a top surface 54a of the free magnetic layer 54.

As illustrated in FIG. 4, each of the magnetoresistance effect films 60 to 65 has an elongated shape in which the dimension L1 in the length direction is longer than the dimension T2 in the width direction, and each of the magnetoresistance effect films 60 to 65 has shape anisotropy (demagnetizing field) in its length direction (in FIG. 4, the Y direction).

The magnitude of shape anisotropy changes if a magnetic layer is removed, although it is not affected if a non-magnetic layer is removed by etching or the like. For reduction of deterioration or variation in magnetic characteristics relative to the structure in which the conductor 66 is not formed, it is desirable that the magnetic layer not be removed. Accordingly, the structure illustrated in FIG. 6 allows less change (most preferably, no change) in the shape anisotropy of the magnetoresistance effect films 61 and 62 to which the conductor 66 is connected than the structure illustrated in FIG. 7. Consequently, deterioration or variation in magnetic characteristics of the sensor unit 20 relative to the structure in which the conductor 66 is not formed can be reduced.

The structure illustrated in FIG. 7, since a portion of the free magnetic layer 54 still exists, the free magnetic layer 54 is not magnetically isolated. Therefore, the change in the shape anisotropy generated in the magnetoresistance effect films 61 and 62 to which the conductor 66 is connected can be made smaller than the change in the shape anisotropy generated in the magnetoresistance effect films 60, 63, 64, and 65 where the conductor 66 is not connected.

Figure 8:
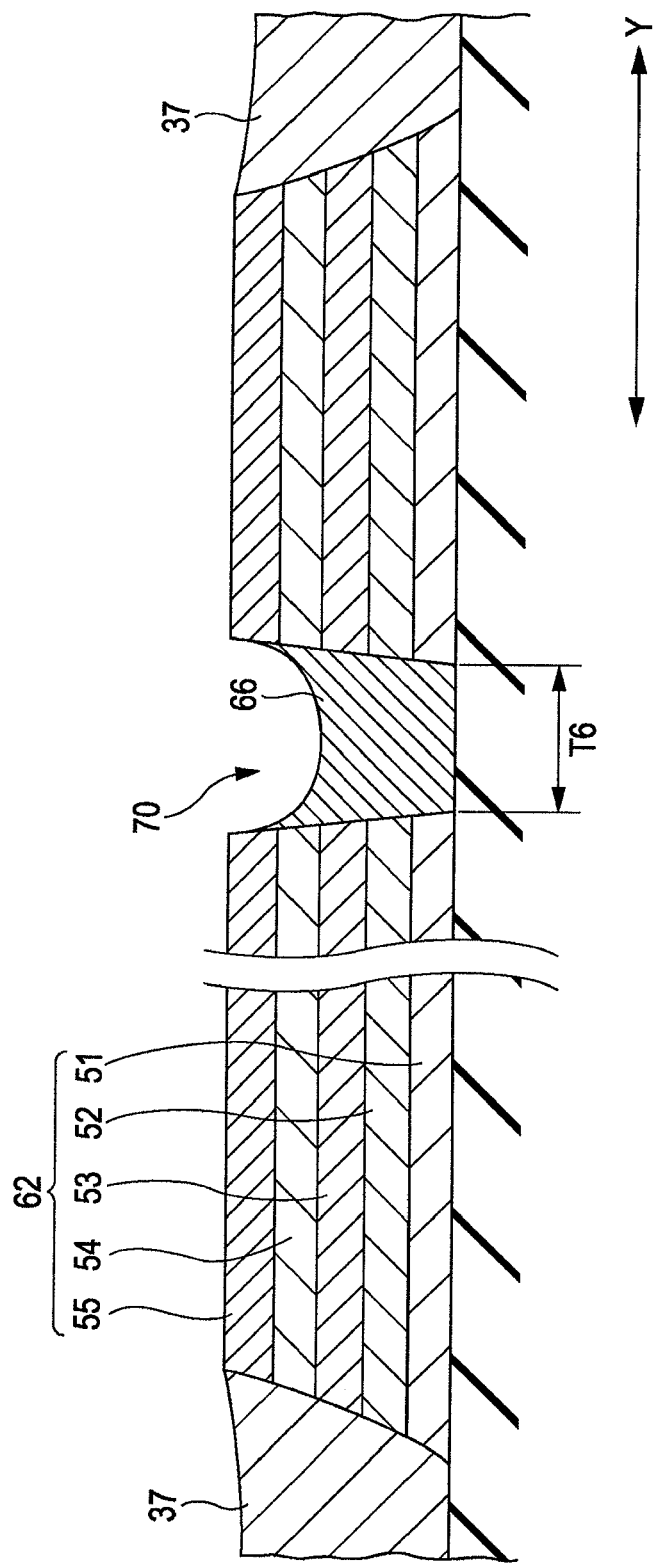
FIG. 8 is a partial cross-sectional view of a sensor unit according to another embodiment of the present invention, which is different from that illustrated in FIG. 6.

Furthermore, as illustrated in FIG. 8, a portion of, for example, the magnetoresistance effect film 62 to which the conductor 66 is to be connected may have a void portion 70 formed therein, where all the layers of the magnetoresistance effect film 62 have been removed. The conductor 66 may be formed in the void portion 70 and electrically connected to the magnetoresistance effect film 62. Even in this configuration, the dimension T6 of the void portion 70 in the direction of the cross-section of the magnetoresistance effect film 62 (that is, the length direction: in FIG. 8, the Y direction) may be made small (specifically, about 2 to 10 μm) so that the free magnetic layer 54 and the fixed magnetic layer 52, which are separated by the void portion 70, are not completely magnetically isolated, thereby avoiding sudden change in shape anisotropy.

The number of magnetoresistance effect films 60 to 65 constituting the sensor pattern 35 may be specifically about 2 to 30. The greater the number of magnetoresistance effect films 60 to 65, the less the relative change in the shape anisotropy of the magnetoresistance effect films 61 and 62 to which the conductor 66 is connected, as observed from the overall sensor pattern 35. Thus, deterioration or variation in magnetic characteristics of the overall sensor pattern 35 can be reduced.

The void portion 70 illustrated in FIG. 8 may be formed in both the magnetoresistance effect films 61 and 62 that are electrically connected to each other via the conductor 66.

In particular, in the structure illustrated in FIG. 8, the position of formation of the conductor 66 may be adjusted close to the return portion 37 that couples the magnetoresistance effect films 61 and 62 so as to increase the path length of current flow between the magnetoresistance effect films 61 and 62 to which the conductor 66 is connected. This can avoid the reduction in shape anisotropy generated in the magnetoresistance effect films 61 and 62 along the length direction within the portion forming the current path, and can reduce deterioration or variation in magnetic characteristics relative to the structure in which the conductor 66 is not formed. The configuration in which the position of formation of the conductor 66 is adjusted close to the return portion 37 that couples the magnetoresistance effect films 61 and 62 can also be applied not only to the structure illustrated in FIG. 8 but also to other structures.

Figure 9:
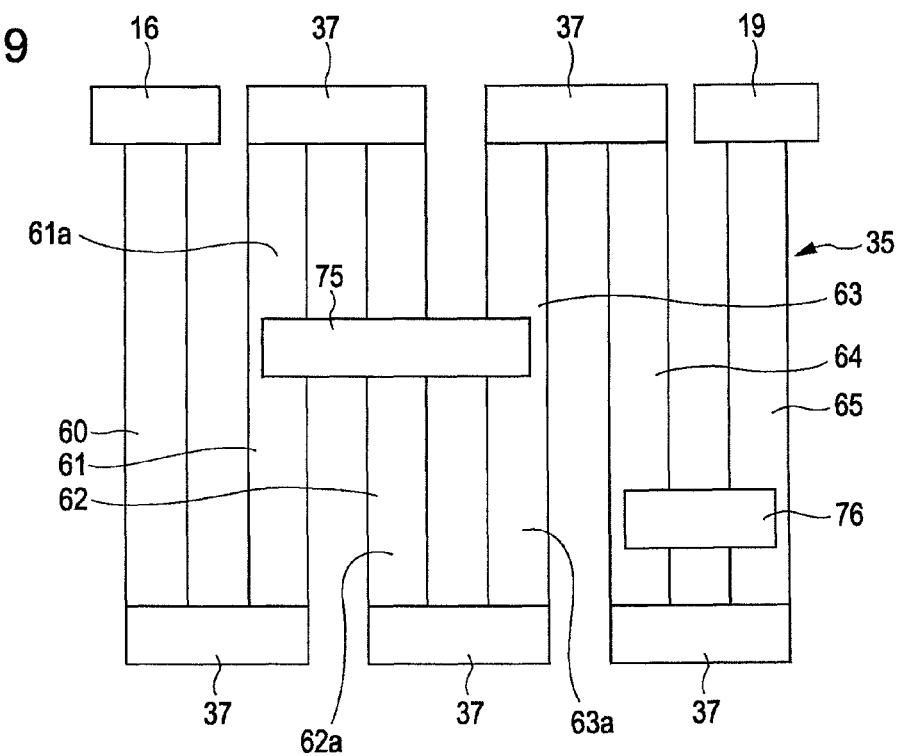
FIG. 9 is a plan view of a sensor unit according to another embodiment of the present invention, which is different from that illustrated in FIG. 4.

Furthermore, as illustrated in FIG. 9, a conductor 75 may be formed so as to couple top surfaces of three or more magnetoresistance effect films, such as top surfaces 61a, 62a, and 63a of magnetoresistance effect films 61, 62, and 63, or conductors 75 and 76 may be disposed at two or more locations in the sensor pattern 35.

Figure 10:
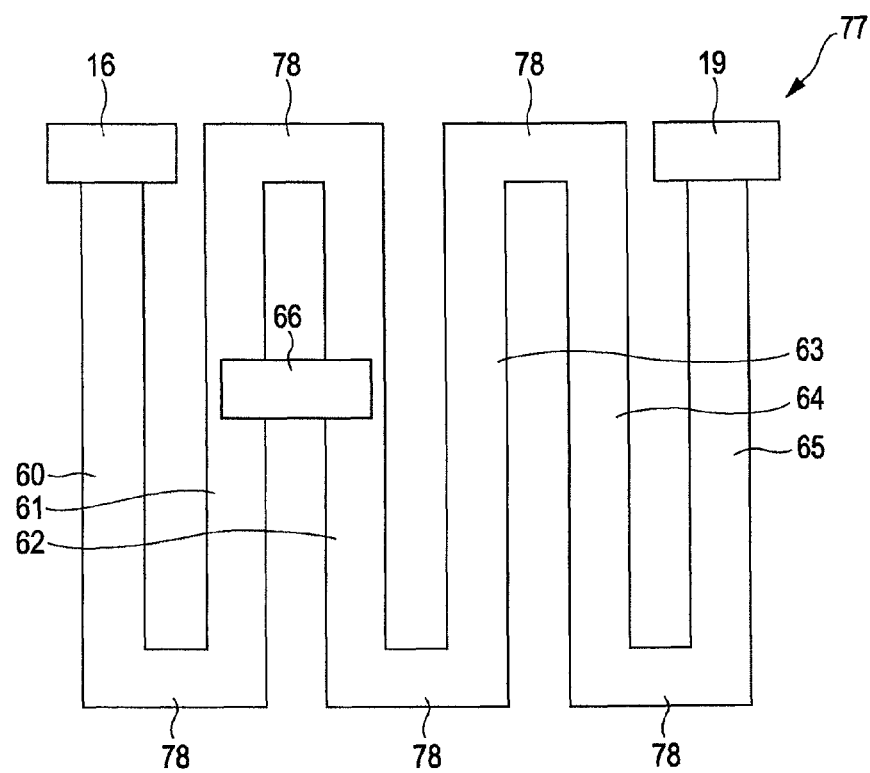
FIG. 10 is a plan view of a sensor unit according to another embodiment of the present invention, which is different from that illustrated in FIG. 4.

The return portions 37 may not necessarily be hard bias layers. In particular, in a structure that does not require the control of the direction of magnetization of the free magnetic layer 54 using biased magnetic fields generated in hard bias layers, as illustrated in FIG. 10, a sensor pattern 77 that is configured such that return portions 78 have the same laminate structure as the magnetoresistance effect films 60 to 65 and that the return portions 78 and the magnetoresistance effect films 60 to 65 are integrally formed may be used.

The laminate structure of the magnetoresistance effect film 62 illustrated in FIG. 7 is a giant magnetoresistance effect (GMR) based element structure (GMR element). Alternatively, an element structure that is based on the tunnel magnetoresistance (TMR) effect in which the non-magnetic material layer 53 is formed of an insulating material such as $Al_2O_3$, that is, a TMR element, or an element structure that is based on the anisotropic magnetoresistance (AMR) effect may be used.

What is claimed is:

1. A magnetic detection device comprising:
a sensor unit including a sensor pattern having a plurality of magnetoresistance effect films that utilize a magnetoresistance effect in which electric resistance values vary in accordance with an external magnetic field applied, and electrode units disposed at both ends of the sensor pattern in a longitudinal direction thereof, ends of the plurality of magnetoresistance effect films in a length direction thereof being coupled via return portions,
wherein a non-magnetic conductor is electrically connected across a top surface of one magnetoresistance effect film and a top surface of another magnetoresistance effect film, the one magnetoresistance effect film and the other magnetoresistance effect film being disposed so as to be coupled via a corresponding one of the return portions, and a resistance value between the electrode units is adjusted,
wherein each of the magnetoresistance effect films has a laminate structure including a magnetic layer and a non-magnetic layer, a topmost layer of the laminate structure being a non-magnetic protective layer, and
wherein a magnetic layer underlies the protective layer, and the conductor is connected to a top surface of the magnetic layer with the protective layer and a portion of the magnetic layer having been removed in a portion to be connected to the conductor.

2. The magnetic detection device according to claim 1, wherein each of the magnetoresistance effect films includes layers that are stacked in order of, from the bottom, an antiferromagnetic layer, a fixed magnetic layer, a non-magnetic material layer, a free magnetic layer, and a protective layer, and the conductor is electrically connected to a top surface of the free magnetic layer with the protective layer and a portion of the free magnetic layer having been removed in a portion to be connected to the conductor.

3. A magnetic detection device comprising:
a sensor unit including a sensor pattern having a plurality of magnetoresistance effect films that utilize a magnetoresistance effect in which electric resistance values vary in accordance with an external magnetic field applied, and electrode units disposed at both ends of the sensor pattern in a longitudinal direction thereof, ends of the plurality of magnetoresistance effect films in a length direction thereof being coupled via return portions,
wherein a non-magnetic conductor is electrically connected across a top surface of one magnetoresistance effect film and a top surface of another magnetoresistance effect film, the one magnetoresistance effect film and the other magnetoresistance effect film being disposed so as to be coupled via a corresponding one of the return portions, and a resistance value between the electrode units is adjusted,
wherein a portion of at least one of the magnetoresistance effect films to which the conductor is to be connected has formed therein a void portion where all layers of the magnetoresistance effect film have been removed, and the conductor is formed in the void portion and is electrically connected to the magnetoresistance effect film.

4. The magnetic detection device according to claim 1, wherein the sensor pattern has a meandering shape.

5. A magnetic detection device comprising:
a sensor unit including a sensor pattern having a plurality of magnetoresistance effect films that utilize a magnetoresistance effect in which electric resistance values vary in accordance with an external magnetic field applied, and electrode units disposed at both ends of the sensor pattern in a longitudinal direction thereof, ends of the plurality of magnetoresistance effect films in a length direction thereof being coupled via return portions,
wherein a non-magnetic conductor is electrically connected across a top surface of one magnetoresistance effect film and a top surface of another magnetoresistance effect film, the one magnetoresistance effect film and the other magnetoresistance effect film being disposed so as to be coupled via a corresponding one of the return portions, and a resistance value between the electrode units is adjusted,
wherein each of the magnetoresistance effect films has a laminate structure including a magnetic layer and a non-magnetic layer, a topmost layer of the laminate structure being a non-magnetic protective layer, and the conductor is electrically connected to a top surface of the protective layer with an oxidation layer on the top surface of the protective layer having been removed at least in a portion to be connected to the conductor.

6. The magnetic detection device according to any of claims 1 to 3, wherein each of the magnetoresistance effect films has an elongated shape in which a dimension in a length direction is longer than a dimension in a width direction.

* * * * *